US006825683B1

(12) United States Patent
Berndt et al.

(10) Patent No.: US 6,825,683 B1
(45) Date of Patent: Nov. 30, 2004

(54) SYSTEM AND METHOD FOR TESTING MULTIPLE INTEGRATED CIRCUITS THAT ARE IN THE SAME PACKAGE

(75) Inventors: Paul D. Berndt, Woodinville, WA (US); Jarie G. Bolander, Redwood City, CA (US); Leah S. Clark, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 72 days.

(21) Appl. No.: 10/125,117

(22) Filed: Apr. 18, 2002

(51) Int. Cl.[7] .............................................. G10R 31/02
(52) U.S. Cl. ...................................... 324/763; 324/765
(58) Field of Search ................................ 324/73.1, 158, 324/763, 765; 714/730, 731, 733, 724; 702/117, 118, 60

(56) References Cited

U.S. PATENT DOCUMENTS

| 4,357,703 A | * | 11/1982 | Van Brunt ................. 324/73.1 |
| 4,509,008 A | * | 4/1985 | DasGupta et al. ........... 714/731 |
| 4,961,053 A | * | 10/1990 | Krug ........................... 324/537 |
| 5,072,175 A | * | 12/1991 | Marek ......................... 714/733 |
| 5,673,276 A | * | 9/1997 | Jarwala et al. .............. 714/727 |
| 6,734,693 B2 | * | 5/2004 | Nakayama ................... 324/763 |

* cited by examiner

Primary Examiner—Vinh P. Nguyen
(74) Attorney, Agent, or Firm—Okamoto & Benedicto LLP (57) ABSTRACT

In one embodiment, a test circuit is coupled to receive a first signal from a signal generator such as a test equipment. The test circuit allows access to one or more terminals of a first integrated circuit, a second integrated circuit, or both based at least on the signal. The test circuit may be in the first integrated circuit. The first integrated circuit and the second integrated circuit may be in a single package. In one embodiment, the test circuit routes signals to and from the second integrated circuit, thus allowing the second integrated circuit to be tested as if it was stand-alone. In one embodiment, the test circuit allows access to otherwise inaccessible terminals of the first integrated circuit, the second integrated circuit, or both.

18 Claims, 5 Drawing Sheets

SYSTEM AND METHOD FOR TESTING MULTIPLE INTEGRATED CIRCUITS THAT ARE IN THE SAME PACKAGE

BACKGROUND OF THE INVENTION

1. Field of the Invention

The present invention relates generally to integrated circuits, and more particularly to methods and apparatus for testing integrated circuits.

2. Description of the Background Art

Some applications call for the placement of multiple integrated circuits in one package. For example, several dies of integrated circuits may be mounted on a single substrate, which is then encapsulated using plastic or ceramic packaging technology. Putting multiple integrated circuits in one package advantageously minimizes printed circuit board space requirements, and facilitates manufacture of custom devices by combining several off-the-shelf integrated circuits. A single package having multiple integrated circuits is also referred to as a multi-chip module.

Multi-chip modules present unique testing problems because embedded integrated circuits may no longer be directly accessible after the packaging process. After packaging, some pads of a die may no longer be able to receive signals from outside the multi-chip module because those pads are connected exclusively to another embedded die. Those pads may also be test pads that are not routed to an external pin of the multi-chip module in order to minimize pin count.

Because of difficulties in testing multi-chip modules, some vendors individually test integrated circuits before packaging them together. Once packaged, the integrated circuits are assumed to be good and not extensively tested. This approach ignores the fact that an integrated circuit may fail during the packaging process (and anytime before it leaves the factory).

Assembled printed circuit boards and multi-chip modules can be tested using the IEEE 1149.1 standard. The IEEE 1149.1 includes guidelines for boundary scan testing, which is useful in verifying the structural integrity of pin-to-pin connections between integrated circuits mounted on a printed circuit board or multi-chip module. However, the serial nature of IEEE 1149.1 results in relatively long test time and cost. The IEEE 1149.1 also does not take advantage of the testability of individual integrated circuits before they were packaged together in a multi-chip module.

SUMMARY

The present invention relates to methods and apparatus for testing multiple integrated circuits in a single package.

In one embodiment, a test circuit is coupled to receive a signal from a signal generator such as a test equipment. The test circuit allows access to one or more terminals of a first integrated circuit, a second integrated circuit, or both based at least on the signal. The test circuit may be in the first integrated circuit. The first integrated circuit and the second integrated circuit may be in a single package.

In one embodiment, the test circuit routes signals to and from the second integrated circuit, thus allowing the second integrated circuit to be tested as if it was stand-alone.

In one embodiment, the test circuit allows access to otherwise inaccessible terminals of the first integrated circuit, the second integrated circuit, or both.

These and other features and advantages of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, circuits, components, and methods to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
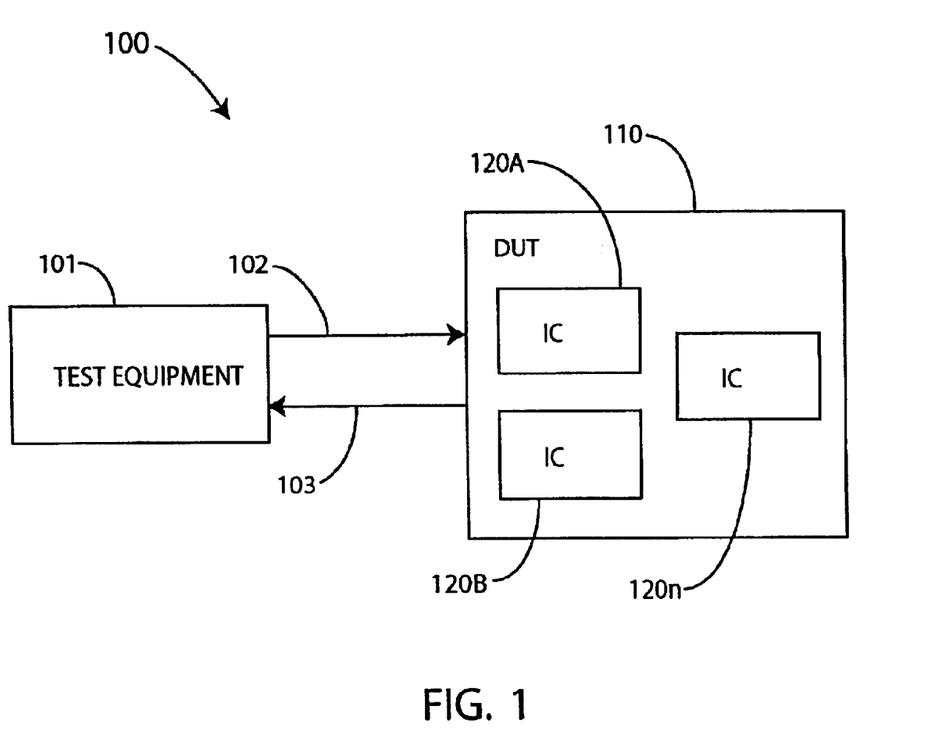
FIG. 1 shows a schematic diagram of a system for testing multiple integrated circuits in a single package in accordance with an embodiment of the present invention.

Referring now to FIG. 1, there is shown a schematic diagram of a system 100 for testing multiple integrated circuits in a single package according to an embodiment of the present invention. System 100 includes a test equipment 101 and a device under test (DUT) 110. Test equipment 101 may be an automated test equipment (ATE), a system of bench-type signal generators and monitors, or any type of device or instrumentation capable of generating and receiving signals. The type of test equipment used does not detract from the merits of the present invention.

In one embodiment, DUT 110 is a multi-chip module having two or more integrated circuits 120 (i.e., 120A, 120B, . . . , 120n) in a single package. Each integrated circuit 120 is embodied in a die; however, each integrated circuit 120 may also be embodied in other forms. During testing, test equipment 101 sends stimulus signals 102 to DUT 110. Stimulus signals 102 may include any type of test pattern or sequence designed to test the functionality of DUT 110. Response signals 103 are generated by DUT 110 in response to stimulus signals 102. As depicted in FIG. 1, stimulus signals 102 and response signals 103 are on two sets of unidirectional lines. It should be understood, however, that stimulus signals 102 and response signals 103 (and all other signals in the present disclosure) may also be on bi-directional lines.

Figure 2:
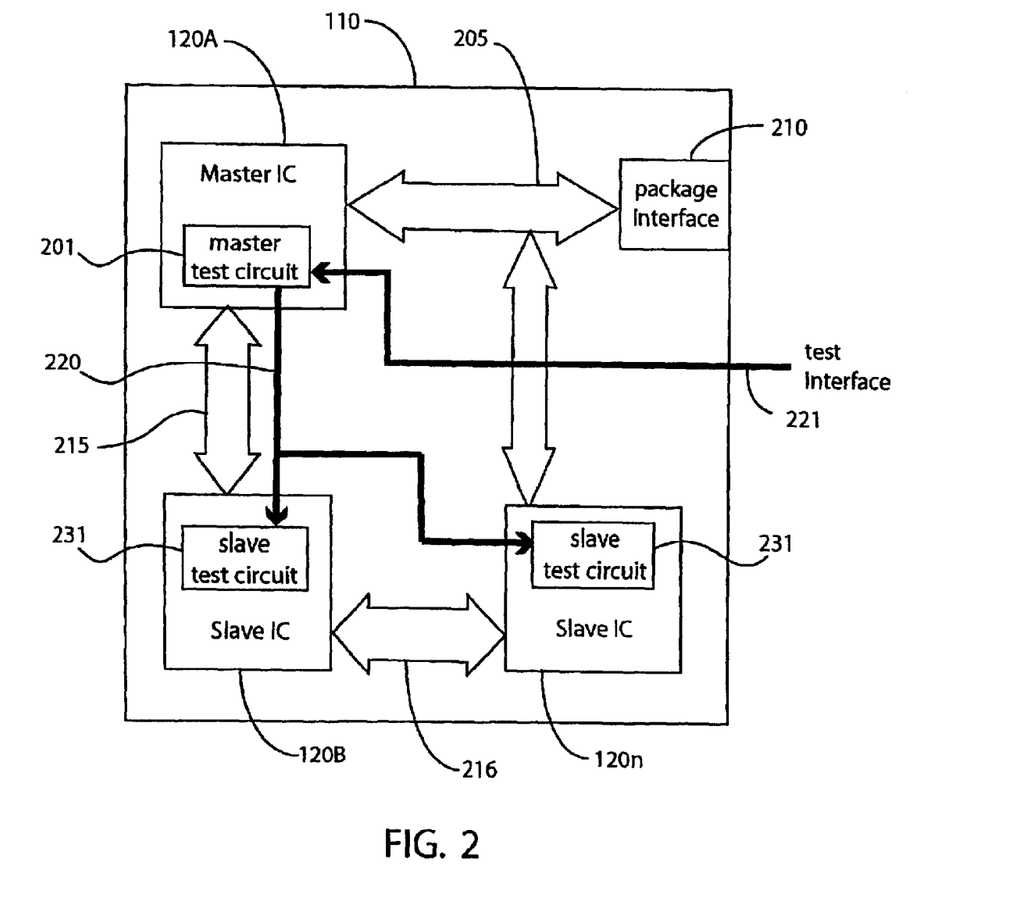
FIG. 2 shows a schematic diagram of a device under test in accordance with an embodiment of the present invention.

FIG. 2 shows a schematic diagram further illustrating the components of a DUT 110 in accordance with an embodiment of the present invention. DUT 110 includes a bus 205 coupled to a package interface 210. In the present disclosure, the word "bus" broadly refers to any set of lines for carrying signals. Because integrated circuits 120 are in die form in this embodiment, signals are coupled to an integrated circuit 120 via die pads. Specifically, bus 205 is coupled to the die pads of integrated circuits 120A.

Package interface 210 couples DUT 110 to the outside world. For example, a test equipment 101 may be coupled to DUT 110 via package interface 210. Package interface 210 may include pins, balls, bumps, etc.

DUT 110 may also include one or more inner-busses, which in the example of FIG. 2 are denoted as inner-bus 215 and inner-bus 216. Inner-bus 215 couples integrated circuit 120A to integrated circuit 120B, whereas inner-bus 216 couples integrated circuit 120B to integrated circuit 120n. It is to be noted that the signal line connections and integrated circuits arrangement shown in FIG. 2 are provided for illustration purposes only. As can be appreciated, embodiments of the present invention may be adapted to test other configurations of multi-chip modules.

Ordinarily, because of their location deep in DUT 110 and because DUT 110 may be covered by packaging material, inner-busses 215 and 216 would be difficult to control and observe from package interface 210. Thus, without the use of embodiments of the present invention, comprehensive testing of DUT 110 would be very difficult to perform. However, in embodiments of the present invention, DUT 110 includes a test circuit in integrated circuits 120 for controlling and observing one or more inner-buses. This facilitates direct access of inner-busses 215 and 16, thereby facilitating comprehensive testing of embedded integrated circuits such as integrated circuit 120B.

In the example of FIG. 2, integrated circuit 120A is designated as a master integrated circuit ("master IC") and accordingly includes a master test circuit 201. The remaining integrated circuits 120 are each designated as a slave integrated circuit ("slave IC") and each includes a slave test circuit 231. That is, integrated circuit 120A is designated as the master IC, while integrated circuits 120B, . . . , 120n are designated as slave ICs. Generally speaking, any integrated circuit 120 may be designated as the master IC. However, the master IC is advantageously the integrated circuit 120 with the most direct lines to package interface 210. For example, in a multi-chip module having a microprocessor and several supporting integrated circuits, the microprocessor is advantageously designated as the master IC if it has a lot of lines that directly lead to the module pins. Each master test circuit 201 and slave test circuit 231 may be incorporated within an integrated circuit 120 as shown in FIG. 2, or implemented within DUT 110 but outside an integrated circuit 120. Advantageously, a test circuit is fabricated in an unused section of an integrated circuit to save space.

Still referring to FIG. 2, master test circuit 201 enables direct access of signal lines on the slave ICs. Master test circuit 201 may be controlled by an apparatus external to DUT 110 (e.g., test equipment 101) using test interface lines 221. Test interface lines 221 may be used to place DUT 110 in test mode, to select a particular test mode (e.g., a test sequence), or to place certain input/output (I/O) lines of integrated circuit 120A in a certain state. Test interface lines 221 typically go through package interface 210, but are separately depicted in FIG. 2 for illustration purposes.

Master test circuit 201 also includes test control lines 220 for sending command signals to each slave test circuit 231. Master test circuit 201 may select a slave test circuit 231 and place it in a particular test mode. Master test circuit 201 may also command one or more slave test circuits 231 to feed-through particular signal lines to package interface 210. That is, master test circuit 201 and slave test circuits 231 may include switching logics (e.g., multiplexers) for routing signals. For example, package interface 210 may be coupled to inner-bus 216 by routing the lines of inner-bus 216 through master test circuit 201 and slave test circuit 231 of integrated circuit 120B. Thereafter, integrated circuit 120n may be comprehensively tested because most of its die pads will then be accessible from package interface 210. Additionally, integrated circuit 120n may then be coupled to a test equipment 101 and tested as a stand-alone integrated circuit. Thus, test programs developed for testing integrated circuit 120n by itself may be used to test integrated circuit 120n in a multi-chip DUT 110.

Master test circuit 201 may also command a slave test circuit 231 to initiate an internal test mode of a slave IC, or to place the slave IC's I/O control lines in a certain state.

Figure 3:
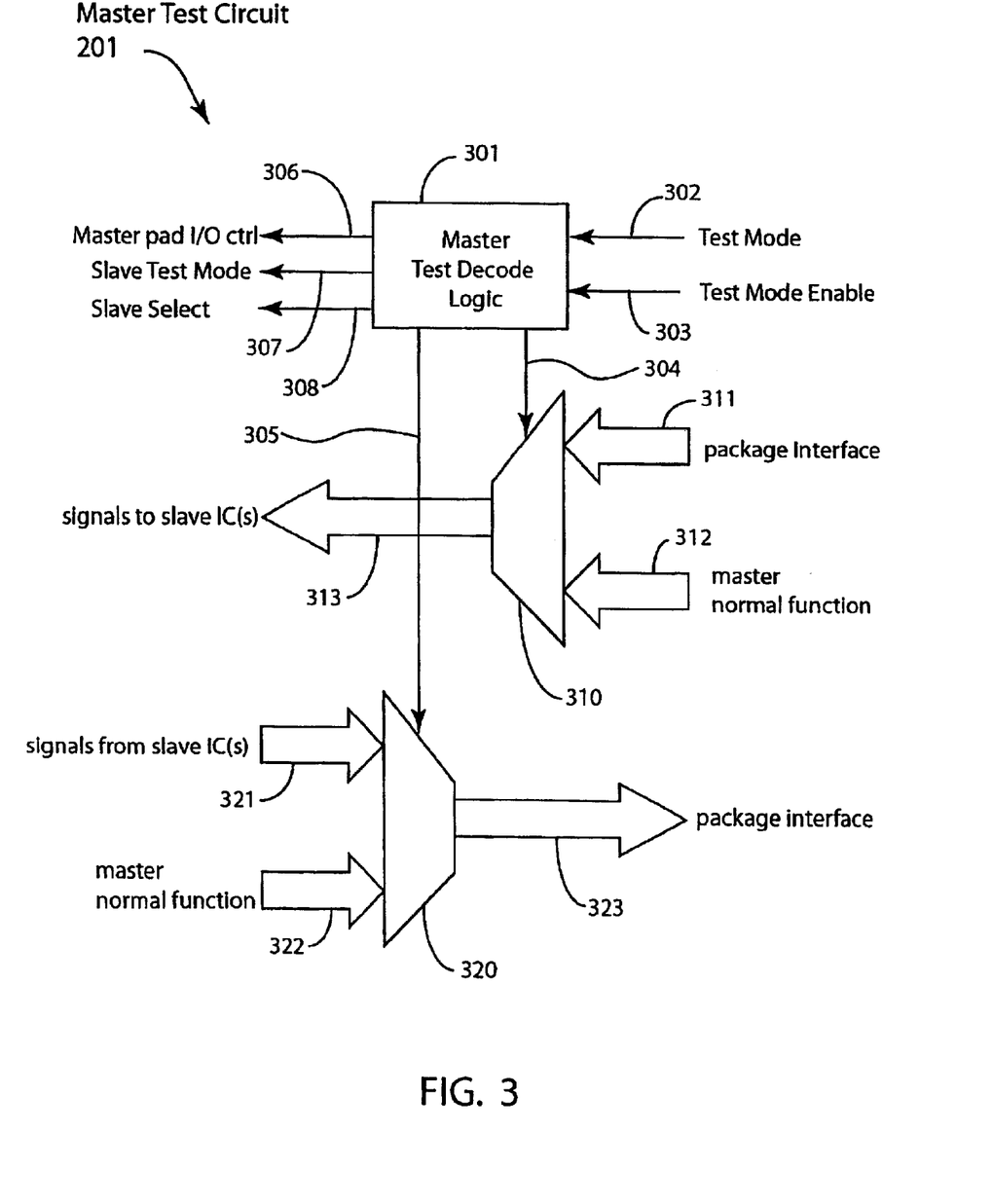
FIG. 3 shows a schematic diagram of a master test circuit in accordance with an embodiment of the present invention.

FIG. 3 shows a schematic diagram of a master test circuit 201 in accordance with an embodiment of the present invention. Master test circuit 201 includes a master test decode logic 301, routing logic 310, and routing logic 320. In one embodiment, master test decode logic 301 includes combinational logic for receiving command signals over package interface 210, for selecting and controlling slave test circuits 231, for controlling routing logics 310 and 320, and for placing the I/O control pads of the master IC in a certain state.

In the example of FIG. 3, master test decode logic 301 receives test mode lines 302 and test mode enable line 303. Test mode lines 302 and test mode enable line 303 may be part of test interface lines 221, and received through package interface 210 (see FIG. 2). DUT 110 is placed in normal function mode when test mode enable line 303 is unasserted. When in normal function mode, signals within DUT 110 are routed as if there were no test circuits in DUT 110. That is, integrated circuits 120 are coupled and configured for normal operation when DUT 110 is in normal function mode.

Asserting test mode enable line 303 places DUT 110 in test mode. When DUT 110 is in test mode, slave ICs may be controlled by the master IC for testing purposes. Also when in test mode, master test decode logic 301 decodes the signals on test mode lines 302 to interpret and execute command signals received from a test equipment 101. For example, test mode lines 302 may include several lines, with each combination of signals on the lines representing a particular command.

I/O control lines 306 may be coupled to the I/O control pads of the master IC. Each line of I/O control lines 306 may be controlled by sending command signals on test mode lines 302. For example, the 110 control pads of the master IC may not be accessible from package interface 210 by design. To place the I/O control pads of the master IC in a certain state, a test equipment 101 may assert test mode enable line 303 to place DUT 110 in test mode, and then send command signals on test mode lines 302 to manipulate (e.g., by setting or resetting) each line of I/O control lines 306. Signals on I/O control lines 306 may initiate an internal test of the master IC, place the master IC in a known state prior to sending stimulus signals to the master IC, or control an otherwise inaccessible pad of the master IC, for example.

Slave test mode lines 307 and slave select lines 308 may be part of test control lines 220 (see FIG. 2) and go to each slave test circuit 231. Signals on slave select lines 308 select a particular slave test circuit 231, while signals on slave test mode lines 307 specify a test mode for the selected slave test circuit 231. Each line of slave test mode lines 307 and slave select lines 308 are controllable by sending appropriate command signals on test mode lines 302. For example, command signals may be sent on test mode lines 302 to select a particular slave test circuit 231 using slave select lines 308. Command signals may also be sent on test mode lines 302 to select a particular test mode for the selected slave test circuit 231 using slave test mode lines 307.

In one embodiment, a slave IC may be tested by first selecting it's slave test circuit 231 and then performing the test. Thereafter, the next slave IC may be selected and tested, and soon.

Command signals may be sent on test mode lines 302 to control routing logics 310 and 320 using control lines 304 and 305, respectively. Routing logics 310 and 320 may be multiplexers, for example. Routing logic 310 includes input nodes 311 for receiving signals from package interface 210. Routing logic 310 also includes input nodes 312 for receiving signals ordinarily routed to a designated slave IC during normal operation. That is, signals that go to a slave IC during normal operation are coupled to input nodes 312. Routing logic 310 also includes output nodes 313 leading to a slave IC. Using control lines 304, either the signals on input nodes 311 or the signals on input nodes 312 may be routed to output nodes 313.

During normal operation, the signals on input nodes 312 may be routed to output nodes 313. During testing, the signals on input nodes 311 may be routed to output nodes 313. This advantageously allows an external apparatus such as a test equipment 101 to directly send stimulus signals 102 (see FIG. 1) to an embedded slave IC during testing.

Routing logic 320 includes input nodes 321 for receiving signals from a slave IC. Routing logic 320 also includes input nodes 322 for receiving signals ordinarily routed to package interface 210 during normal operation. For example, signals going from a master IC to package interface 210 during normal operation may be coupled to input nodes 322. Routing logic 320 also includes output nodes 323 leading to package interface 210. Using control lines 305, either the signals on input nodes 321 or the signals on input nodes 322 may be routed to output nodes 323.

During normal operation, the signals on input nodes 322 may be routed to output nodes 323. During testing, the signals on input nodes 321 may be routed to output nodes 323. This advantageously allows an external apparatus such as a test equipment 101 to directly receive response signals 103 (see FIG. 1) from an embedded slave IC during testing.

Figure 4:
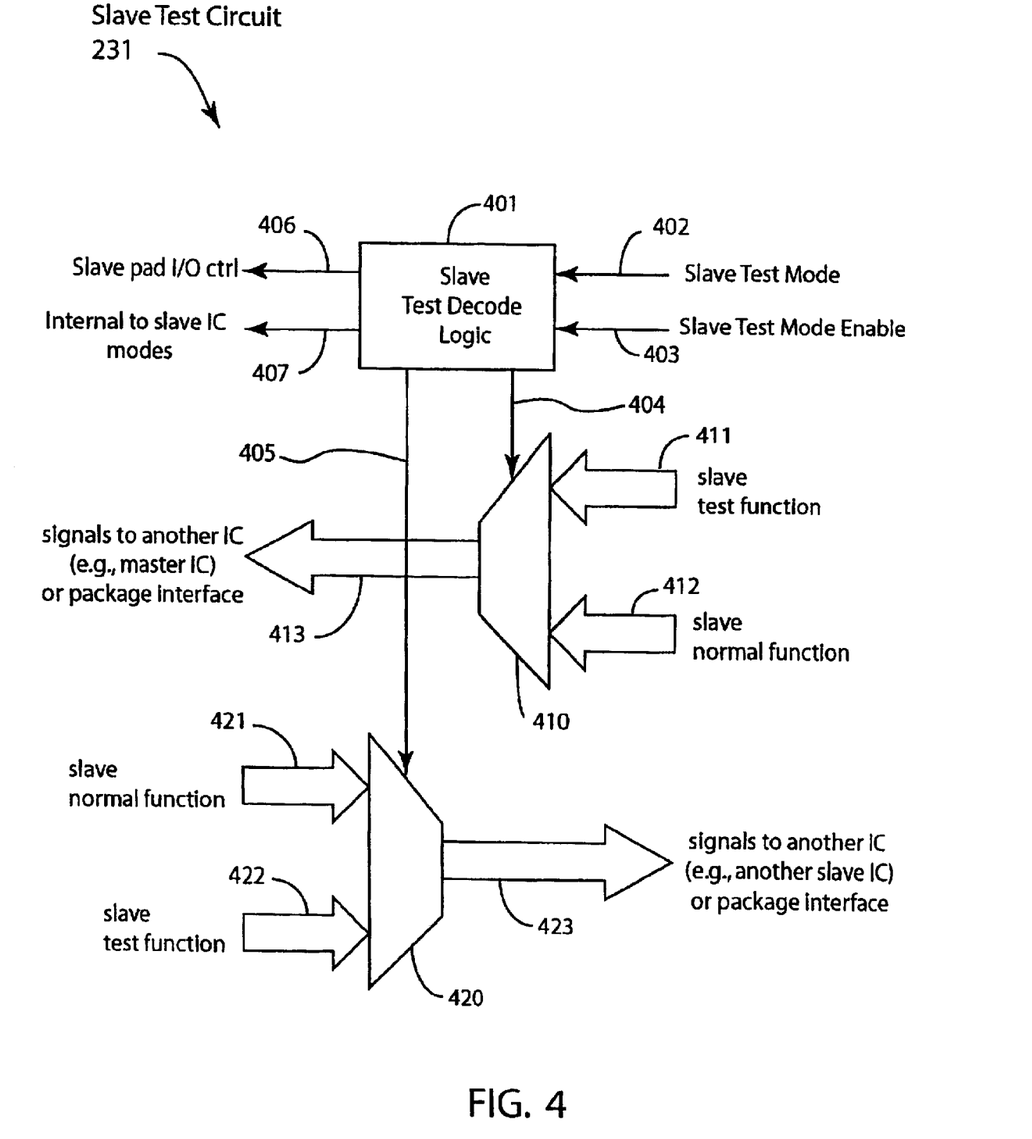
FIG. 4 shows a schematic diagram of a slave test circuit in accordance with an embodiment of the present invention.

Referring now to FIG. 4, there is shown a slave test circuit 231 in accordance with an embodiment of the present invention. Slave test circuit 231 includes a slave test decode logic 401, routing logic 410, and routing logic 420. In one embodiment, slave test decode logic 401 includes combinational logic for receiving command signals from a master test circuit 201, for controlling routing logics 410 and 420, and for placing the I/O control pad of the slave IC in a certain state.

In the example of FIG. 4, slave test decode logic 401 receives slave test mode lines 402 and slave test mode enable line 403. Slave test mode lines 402 may be part of test control lines 220 (see FIG. 2), and may be coupled to slave test mode lines 307 of a master test circuit 201 (see FIG. 3). Slave test mode enable line 403 may be derived by decoding slave select lines 308 of a master test circuit 201.

Slave test circuit 231 may be placed in test mode by asserting slave test mode enable line 403. When in test mode, slave test decode logic 401 decodes command signals on slave test mode lines 402. For example, slave test mode lines 402 may include several lines, with each combination of signals on the lines representing a particular command from a master test circuit 201.

I/O control lines 406 may be coupled to the I/O control pads of the slave IC. Each line of I/O control lines 406 may be controlled by sending command signals on test slave mode lines 402. For example, the I/O control pads of the slave IC may not be accessible from package interface 210 by design. To place the I/O control pads of the slave IC in a certain state, a command to do so may be sent to master test circuit 201. In response, master test circuit 201 may then send the appropriate command signals on slave test mode lines 402 to manipulate each line of I/O control lines 406. Signals on I/O control lines 406 may initiate an internal test of the slave IC, place the slave IC in a known state prior to sending stimulus signals to the slave IC, or control an otherwise inaccessible pad of the slave IC, for example.

Command signals may be sent on slave test mode lines 402 to manipulate lines 407, which may be coupled to internal nodes of the slave IC. For example, lines 407 may be manipulated to initiate an internal test of the slave IC or to place the slave IC in a particular mode. As can be appreciated, lines 407 may be coupled to nodes that may otherwise be inaccessible for testing or other purposes.

Command signals may be sent on slave test mode lines 402 to control routing logics 410 and 420 using control lines 404 and 405, respectively. Routing logics 410 and 420 may be multiplexers, for example. Routing logic 410 includes input nodes 411 for receiving signals to be routed to another slave IC, a master IC, or package interface 210. For example, lines of the slave IC that may otherwise be inaccessible may be coupled to input nodes 411. As another example, lines originating from another slave IC may be coupled to input nodes 411. This allows signals from one slave IC to be transmitted through another slave IC for routing to the master IC or package interface 210.

Routing logic 410 includes input nodes 412 for receiving signals ordinarily routed to another slave IC, a master IC, or package interface 210 during normal operation. For example, signals that go from the slave IC to the master IC during normal operation may be coupled to input nodes 412. Routing logic 410 also includes output nodes 413 leading to another slave IC, a master IC, or package interface 210. Using control lines 404, either the signals on input nodes 411 or the signals on input nodes 412 may be routed to output nodes 413.

During normal operation, the signals on input nodes 412 may be routed to output nodes 413. During testing and depending on the test, either the signals on input nodes 411 or the signals on input nodes 412 may be routed to output nodes 413. This advantageously allows an external apparatus such as a test equipment 101 to directly receive response signals 102 (see FIG. 1) from an embedded slave IC during testing.

Routing logic 420 includes input nodes 421 for receiving signals ordinarily routed to another slave IC, a master IC, or package interface 210 during normal operation. During normal operation, routing logic 420 may be used to route signals to one destination (e.g., integrated circuit 120n) while routing logic 410 may be used to route signals to another destination (e.g., integrated circuit 120A).

Routing logic 420 includes input nodes 422 for receiving signals to be routed to another slave IC, a master IC, or package interface 210. For example, lines of the slave IC that may otherwise be inaccessible may be coupled to input nodes 422 for routing to package interface 210. As another example, input nodes 422 may be used to feed-through lines originating from another slave IC.

Routing logic 420 also includes output nodes 423, which lead to another slave IC, a master IC, or package interface 210. Using control lines 405, either the signals on input nodes 421 or the signals on input nodes 422 may be routed to output nodes 423.

During normal operation, the signals on input nodes 421 may be routed to output nodes 423. During testing and depending on the test, either the signals on input nodes 422 or the signals on input nodes 421 may be routed to output nodes 423.

Figure 5:
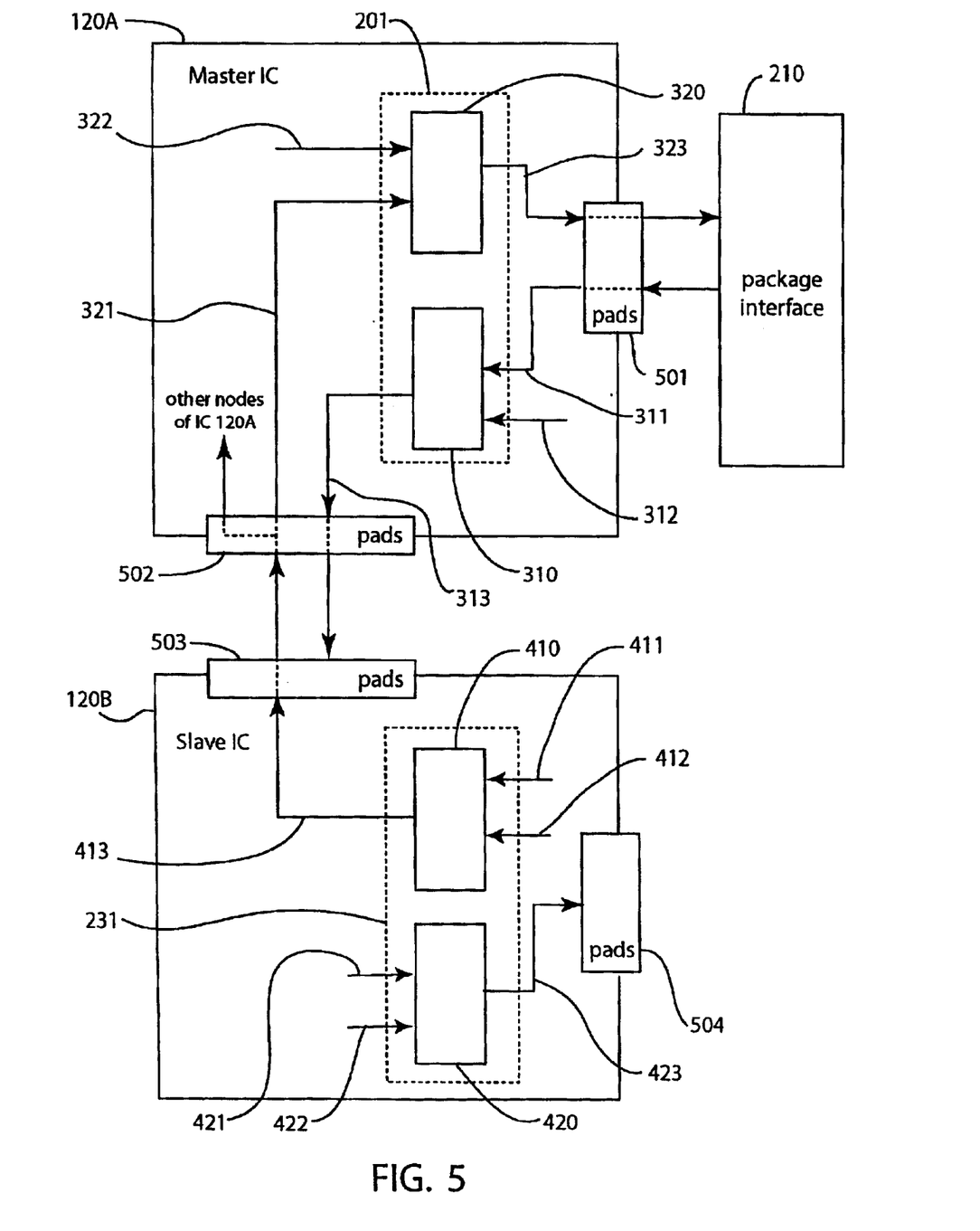
FIG. 5 illustrates an example inter-connection between a master integrated circuit and a slave integrated circuit in accordance with an embodiment of the present invention.

An example inter-connection between a master IC and a slave IC is now described with reference to the schematic diagram of FIG. 5. In the example of FIG. 5, integrated circuit 120A is designated as the master IC and accordingly includes a master test circuit 201; integrated circuit 120B is designated as a slave IC and accordingly includes a slave test circuit 231. Only the routing logics of the test circuits are shown in FIG. 5 for clarity. Additionally, the inter-connection shown in FIG. 5 may be extended to accommodate additional slave ICs.

In the example of FIG. 5, lines from package interface 210 are coupled to input nodes 311 via die pads 501. Lines from integrated circuit 120A that go to integrated circuit 120B during normal operation are coupled to input nodes 312. Thus, during normal operation, signals on input nodes 312 are coupled to integrated circuit 120B via routing logic 310, output nodes 313, die pads 502, and die pads 503. During testing, signals on input nodes 311 are coupled to integrated circuit 120B via routing logic 310, output nodes 313, die pads 502, and die pads 503. For example, a test equipment 101 may directly send stimulus signals to integrated circuit 120B via package interface 210, pads 501, input nodes 311, routing logic 310, output nodes 313, die pads 502, and die pads 503.

Signals that go from integrated circuit 120A to package interface 210 during normal operation are transmitted over input nodes 322, routing logic 320, output nodes 323, and die pads 501.

In the example of FIG. 5, lines that go from integrated circuit 120B to integrated circuit 120A during normal operation are coupled to input nodes 412. During normal operation, signals on input nodes 412 are coupled to integrated circuit 120A via routing logic 410, output nodes 413, die pads 503, and die pads 502; from die pads 502, the signals may then go to other nodes of integrated circuit 120A.

During testing, signals on input nodes 411 or input nodes 412 may be coupled to package interface 210 via routing logic 410, output nodes 413, die pads 503, die pads 502, input nodes 321, routing logic 320, output nodes 323, and die pads 501. This allows signals that may otherwise be inaccessible to be routed to package interface 210. For example, signals on input nodes 412 may be received by a test equipment 101 coupled to package interface 210. Similarly, signals on input nodes 411 (which may be originating from other slave ICs or otherwise inaccessible lines of integrated circuit 120B) may also be received by a test equipment 101 coupled to package interface 210.

In the example of FIG. 5, routing logic 420 includes output nodes 423 coupled to die pads 504. Die pads 504, in turn, may be coupled to integrated circuit 120A, another slave IC, or to package interface 210. During normal operation, the signals on input nodes 421 are routed to output nodes 423. During testing and depending on the test, either the signals on input nodes 421 or input nodes 422 may be routed to output nodes 423 and onto die pads 504.

Still referring to the example of FIG. 5, integrated circuit 120B may be tested stand-alone by sending stimulus signals to integrated circuit 120B via package interface 210, die pads 501, input nodes 311, routing logic 310, output nodes 313, die pads 502, and die pads 503. The stimulus signals may be developed using Automatic Test Pattern Generation (ATPG) software and generated by a test equipment 101 coupled to package interface 210, for example. Response signals from integrated circuit 120B may be routed via input nodes 411 or 412, routing logic 410, output nodes 413, die pads 503, die pads 502, input nodes 321, routing logic 320, output nodes 323, die pads 501, and package interface 210.

As can be appreciated, embodiments of the present invention allow for comprehensive testing of multi-chip modules. By routing otherwise inaccessible signals to and from the package interface, the integrated circuits in the multi-chip module may be comprehensively tested. Additionally, the integrated circuits may be tested using test programs designed for testing individual integrated circuits. Among other advantages, this simplifies testing of multi-chip modules, reduces test development time, and also facilitates debugging of failed modules. Embodiments of the present invention also allow for comprehensive testing of multi-chip modules by providing a way to control otherwise inaccessible lines (e.g., I/O control pads, internal nodes) of an integrated circuit. Thus, embodiments of the present invention help increase test coverage, which in turn results in lower multi-chip module failures in the field.

Improved techniques for testing multiple integrated circuits in a single package have been disclosed. While specific embodiments have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A system for testing integrated circuits comprising:
   a signal generator generating a plurality of test signals; and
   a device under test coupled to receive the plurality of test signals in parallel, the device under test including a first integrated circuit and a second integrated circuit that are in a single package, the second integrated circuit including a plurality of input terminals not directly accessible from external terminals of the device under test, the first integrated circuit including a test circuit configured to allow routing of the plurality of test signals to the plurality of input terminals of the second integrated circuit in parallel.

2. The system of claim 1 wherein the test circuit is configured to route the plurality of test signals to the plurality of input terminals of the second integrated circuit during a first mode of operation.

3. The system of claim 2 wherein the first mode of operation is a test mode for testing the device under test.

4. The system of claim 1 wherein the plurality of test signals comprise a test pattern designed for testing the second integrated circuit before being packaged along with the first integrated circuit.

5. the system of claim 1 wherein the first integrated circuit is in the form of a die.

6. The system of claim 1 wherein the plurality of input terminals of the second integrated circuit comprise die pads.

7. The system of claim 1 wherein the test circuit is coupled to receive command signals from the signal generator to allow for manipulation of internal pads of the first integrated circuit.

8. The system of claim 1 wherein the test circuit is coupled to receive command signals from the signal generator to allow for manipulation of internal pads of the second integrated circuit.

9. The system of claim 1 wherein the second integrated circuit further includes a slave circuit coupled to receive command signals from the test circuit.

10. A method of testing an integrated circuit comprising:
    providing a first set of test signals to a first integrated circuit;

routing the first set of test signals from the first integrated circuit to a second integrated circuit in parallel, the first integrated circuit and the second integrated circuit being in a single package; and testing the second integrated circuit using the first set of test signals.

11. The method of claim 10 wherein the first integrated circuit and second integrated circuit are each in die form.

12. The method of claim 10 wherein the first set of test signals are routed to die pads of the second integrated circuit in parallel.

13. The method of claim 10 further comprising:

selectively routing a second set of test signals through the first integrated circuit, the second integrated circuit, and onto a third integrated circuit in parallel, the third integrated circuit being in the single package.

14. The method of claim 10 further comprising:

selectively routing a second set of test signals through the first integrated circuit and into a third integrated circuit in parallel, the third integrated circuit being in the single package.

15. The method of claim 10 further comprising accessing an internal node of the first integrated circuit based at least on a signal in the first set of test signals.

16. The method of claim 10 wherein the plurality of test signals initiate an internal functional test mode of the second integrated circuit.

17. A multi-chip module comprising:

means for decoding and executing command signals in the first integrated circuit; and means for accessing a plurality of terminals of a second integrated circuit based at least on a signal in the command signals, the means for accessing being in the second integrated circuit, the first integrated circuit and the second integrated circuit being in the same multi-chip module.

18. The multi-chip module of claim 17 further comprising:

means for initiating an internal test mode of the second integrated circuit, the initiating means being in the second integrated circuit.

* * * * *

INTER PARTES REEXAMINATION CERTIFICATE (1275th)
United States Patent
Berndt et al.

(10) Number: US 6,825,683 C1
(45) Certificate Issued: May 25, 2016

(54) SYSTEM AND METHOD FOR TESTING MULTIPLE INTEGRATED CIRCUITS THAT ARE IN THE SAME PACKAGE (75) Inventors: Paul D. Berndt, Woodinville, WA (US); Jarie G. Bolander, Redwood City, CA (US); Leah S. Clark, San Diego, CA (US)

(73) Assignee: SANSOCCA ALANDRO A.B., LLC, Dover, DE (US)

Reexamination Request:
No. 95/001,665, Jun. 17, 2011

Reexamination Certificate for:
Patent No.: 6,825,683
Issued: Nov. 30, 2004
Appl. No.: 10/125,117
Filed: Apr. 18, 2002

(51) Int. Cl.
*G01R 31/28* (2006.01)
*G01R 31/317* (2006.01)
*G01R 31/3185* (2006.01)

(52) U.S. Cl.
CPC .. *G01R 31/318513* (2013.01); *G01R 31/31722* (2013.01)

(58) Field of Classification Search
None
See application file for complete search history.

(56) References Cited

To view the complete listing of prior art documents cited during the proceeding for Reexamination Control Number 95/001,665, please refer to the USPTO's public Patent Application Information Retrieval (PAIR) system under the Display References tab.

*Primary Examiner* — Anjan Deb (57) ABSTRACT

In one embodiment, a test circuit is coupled to receive a first signal from a signal generator such as a test equipment. The test circuit allows access to one or more terminals of a first integrated circuit, a second integrated circuit, or both based at least on the signal. The test circuit may be in the first integrated circuit. The first integrated circuit and the second integrated circuit may be in a single package. In one embodiment, the test circuit routes signals to and from the second integrated circuit, thus allowing the second integrated circuit to be tested as if it was stand-alone. In one embodiment, the test circuit allows access to otherwise inaccessible terminals of the first integrated circuit, the second integrated circuit, or both.

INTER PARTES REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 9, 13, 14, 17 and 18 is confirmed.

Claims 1-8, 10-12, 15 and 16 are cancelled.

New claims 19-34 are added and determined to be patentable.

*19. The system of claim 1, further comprising a first inner bus coupling the first integrated circuit to the second integrated circuit, wherein the test circuit in the first integrated circuit controls the first inner bus.*

*20. The system of claim 19, further comprising a package interface coupling the signal generator to the device under test.*

*21. The system of claim 20, wherein the package interface is coupled to the first inner bus thereby allowing testing of the second integrated circuit as a stand-alone integrated circuit.*

*22. The system of claim 9, wherein the test circuit is configured to cause the slave circuit to initiate an internal test mode of the second integrated circuit.*

*23. The system of claim 22, wherein the test circuit enables direct access of signal lines on the slave circuit.*

*24. The system of claim 1, wherein the signal generator is located in a test apparatus separate from the device under test.*

*25. The system of claim 24, further comprising at least one test interface line, the test apparatus controlling the test circuit via the at least one test interface line.*

*26. The system of claim 9, wherein the test circuit or the slave circuit or both, include switching logic for routing the test signals.*

*27. The system of claim 20, wherein the package interface is coupled to the inner bus.*

*28. The system of claim 1, further comprising:*
*a third integrated circuit, the third integrated circuit including a second slave circuit coupled to receive command signals; and*
*a second inner bus coupling the second integrated circuit to the third integrated circuit, wherein the test circuit in the first integrated circuit controls the second inner bus.*

*29. The system of claim 28, wherein the third integrated circuit is coupled to the test apparatus and tested as a stand-alone integrated circuit.*

*30. The system of claim 28, wherein the third integrated circuit further comprises routing logic for transmitting control signals to the test circuit via the second integrated circuit.*

*31. The system of claim 1, the first integrated circuit having used and unused portions, wherein the test circuit resides in the unused portion of the first integrated circuit.*

*32. The system of claim 9, wherein the slave circuit further comprises routing logic for transmitting control signals to the test circuit.*

*33. The system of claim 1, wherein the second integrated circuit further comprises a first slave circuit coupled to receive command signals from the test circuit, the test circuit and the slave circuit each embodied in a die, the system further comprising:*
*a test apparatus housing the signal generator, the test apparatus located separate from the device under test;*
*a package interface coupling the signal generator to the device under test;*
*a third integrated circuit having a second slave circuit, wherein the first slave circuit and the second slave circuit each include routing logic for allowing signals to be routed between the first slave circuit or the second slave circuit or both, and the test circuit;*
*a first inner bus coupling the test circuit to the first slave circuit; and*
*a second inner bus coupling the first slave circuit to the second slave circuit, wherein the test circuit controls the first slave circuit or the second slave circuit, or both.*

*34. The system of claim 9, wherein the test circuit is configured to cause the slave circuit to initiate an internal test mode of the second integrated circuit, wherein the test circuit or the slave circuit or both, include switching logic for routing the test signals, and wherein the slave circuit further comprises routing logic for transmitting control signals to the test circuit.*

* * * * *